(12) United States Patent
Hikita et al.

(10) Patent No.: US 8,164,115 B2
(45) Date of Patent: *Apr. 24, 2012

(54) NITRIDE SEMICONDUCTOR DEVICE

(75) Inventors: Masahiro Hikita, Hyogo (JP); Tetsuzo Ueda, Osaka (JP); Manabu Yanagihara, Osaka (JP); Yasuhiro Uemoto, Shiga (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/010,238

(22) Filed: Jan. 20, 2011

(65) Prior Publication Data

US 2011/0114967 A1  May 19, 2011

Related U.S. Application Data

(62) Division of application No. 11/890,480, filed on Aug. 7, 2007, now Pat. No. 7,898,002.

(30) Foreign Application Priority Data

Sep. 29, 2006  (JP) .................................. 2006-267476

(51) Int. Cl.
*H01L 21/337* (2006.01)
*H01L 21/335* (2006.01)

(52) U.S. Cl. ....................................................... 257/192
(58) Field of Classification Search .................. 257/20, 257/94, 183, E29.246, E29.248, E29.249, 257/E29.253, E29.254, 213–413, 900, 902, 257/903, 504, E27.148, E29.65, E29.314, 257/54, 73, 155, 156, 192–195
See application file for complete search history.

(56) References Cited

U.S. PATENT DOCUMENTS

| 5,866,925 | A  | 2/1999  | Zolper et al. |
| 7,038,252 | B2 | 5/2006  | Saito et al.  |
| 7,467,918 | B2 | 12/2008 | Yao et al.    |
| 7,576,373 | B1 | 8/2009  | Hikita et al. |

(Continued)

FOREIGN PATENT DOCUMENTS

JP  11-261053  9/1999

(Continued)

OTHER PUBLICATIONS

Japanese Notice of Reasons for Rejections, with English Translation, issued in Japanese Patent Application No. 2006-267476, mailed Feb. 22, 2011.

(Continued)

*Primary Examiner* — Dao H Nguyen
*Assistant Examiner* — Tram H Nguyen
(74) *Attorney, Agent, or Firm* — McDermott Will & Emery LLP

(57) ABSTRACT

A nitride semiconductor device includes: a substrate; a first nitride semiconductor layer formed over the substrate; a second nitride semiconductor layer formed on the first nitride semiconductor layer and having a larger band gap energy than the first nitride semiconductor layer; a third nitride semiconductor layer formed on the second nitride semiconductor layer and including a p-type nitride semiconductor with at least a single-layer structure; a gate electrode formed on the third nitride semiconductor layer; and a source electrode and a drain electrode formed in regions located on both sides of the gate electrode, respectively. The third nitride semiconductor layer has a thickness greater in a portion below the gate electrode than in a portion below the side of the gate electrode.

5 Claims, 6 Drawing Sheets

U.S. PATENT DOCUMENTS

| | | | |
|---|---|---|---|
| 7,777,252 B2 | 8/2010 | Sugimoto et al. | |
| 7,898,002 B2 * | 3/2011 | Hikita et al. | 257/192 |
| 2003/0209762 A1 * | 11/2003 | Nishii et al. | 257/347 |
| 2005/0173728 A1 * | 8/2005 | Saxler | 257/192 |
| 2005/0189559 A1 | 9/2005 | Saito et al. | |
| 2006/0060871 A1 | 3/2006 | Beach | |
| 2006/0175633 A1 | 8/2006 | Kinzer | |
| 2006/0273347 A1 | 12/2006 | Hikita et al. | |
| 2007/0176125 A1 * | 8/2007 | Natori et al. | 250/493.1 |
| 2007/0176215 A1 | 8/2007 | Yanagihara et al. | |
| 2007/0278521 A1 * | 12/2007 | Ishida et al. | 257/192 |
| 2007/0284568 A1 | 12/2007 | Bito | |
| 2008/0054300 A1 | 3/2008 | Nikkel et al. | |
| 2009/0121775 A1 | 5/2009 | Ueda et al. | |
| 2009/0146182 A1 | 6/2009 | Hikita et al. | |

FOREIGN PATENT DOCUMENTS

| | | |
|---|---|---|
| JP | 2000-349095 | 12/2000 |
| JP | 2004-273486 | 9/2004 |
| JP | 2005-244072 | 9/2005 |
| JP | 2006-032749 | 2/2006 |
| JP | 2007-335508 | 12/2007 |

OTHER PUBLICATIONS

S. Arulkumaran, et al., "Studies on the Influences of i-GaN, n-GaN, p-GaN and InGaN Cap Layers in AlGaN/GaN High-Electron-Mobility Transistors," Jpn. J. Appl. Phys., Japan, JJAP, 2005, Vol. 44, No.5A, p. 2953-2960.

Kawasaki, T., et al., "Normally-off AlGaN/GaN HEMT with Recessed Gate for High Power Applications", Solid State Devices and Materials Tech. Digest, 2005, pp. 206-207.

Kuroda, M., et al., "Normally-off Operation of Non-polar AlGaN/GaN Heterojunction FETs Grown on R-plane Sapphire", Solid State Devices and Materials Tech. Digest, 2005, pp. 470-471.

U.S. Notice of Allowance, issued in U.S. Appl. No. 11/890,480, mailed on Nov. 2, 2010.

* cited by examiner

NITRIDE SEMICONDUCTOR DEVICE

CROSS-REFERENCE TO RELATED APPLICATIONS

This application is a Divisional of U.S. patent application Ser. No. 11/890,480, filed on Aug. 7, 2007, now U.S. Pat. No. 7,898,002, and claims priority under 35 U.S.C. §119 on Patent Application No. 2006-267476 filed in Japan on Sep. 29, 2006, the entire contents of each of which are hereby incorporated by reference.

BACKGROUND OF THE INVENTION (a) Fields of the Invention

The present invention relates to nitride semiconductor devices applicable to power transistors for use in power supply circuits, and to their fabrication methods.

(b) Description of Related Art

In recent years, field effect transistors (FETs) made of gallium nitride (GaN)-based compound semiconductor materials have been actively studied as high-frequency, high-power devices.

Since nitride semiconductor materials such as GaN can form various types of mixed crystals such as aluminum nitride (AlN) and indium nitride (InN), they can form heterojunctions like conventional arsenic-based semiconductor materials such as gallium arsenide (GaAs). In particular, the heterojunction composed of the nitride semiconductor is characterized in that even with no doping performed thereon, high concentrations of carriers are generated at its interface by spontaneous polarization or piezoelectric polarization. As a result of this, in the case where a FET is fabricated from this material, the fabricated FET is likely to exhibit depletion type (normally-on type) characteristics, and hence it is difficult for the FET to exhibit enhancement-type (normally-off type) characteristics. However, most devices currently used in the power electronics market are normally-off type devices, so that normally-off type GaN-based nitride semiconductor devices are strongly demanded.

Approaches to attain normally-off type transistors include: use of the structure in which a gate portion is dug to shift a threshold voltage positively (see, for example, T. Kawasaki et al., "Solid State Devices and Materials 2005 tech. digest", pp. 206); use of the structure in which a FET is fabricated on the (10-12) plane of the orientation in a sapphire substrate to prevent a polarization electric field from being generated in the crystal growth direction of the nitride semiconductor (see, for example, M. Kuroda et al., "Solid State Devices and Materials 2005 tech. digest", pp. 470); and the like. As a potential structure for realizing the normally-off type FET, a junction field effect transistor (JFET) is proposed in which a p-type GaN layer is formed in a gate portion (see, for example, Japanese Unexamined Patent Publication No. 2005-244072). In this specification, the minus sign "−" attached to Miller indices included in the orientation represents the reversal of the index following the minus sign for convenience.

In the JFET structure, piezoelectric polarization generated at a first heterointerface between a channel layer of undoped GaN and a barrier layer of undoped AlGaN is cancelled by another piezoelectric polarization generated at a second heterointerface between the AlGaN barrier layer and a p-type GaN layer formed on the AlGaN barrier layer. This selectively decreases the concentration of two-dimensional electron gas immediately below a gate portion formed with the p-type GaN layer, whereby the JFET with normally-off characteristics can be provided. In addition, by employing, in the gate electrode, a pn junction having a higher built-in potential than a Schottky junction composed of metal and semiconductor, gate turn on voltage can be raised. This provides an advantage that even though a positive gate voltage is applied, a gate leakage current can be reduced to a low value.

However, as a result of fabrication of the conventional JFET as shown in FIG. 11, the inventors of the present invention found out the fact that a drain current decreases when a high drain voltage is applied, that is, a so-called current collapse occurs.

As shown in FIG. 11, the conventional JFET made of a nitride semiconductor includes a buffer layer 102 of AlN, a channel layer 103 of undoped GaN, a barrier layer 104 of undoped AlGaN, and a p-type GaN layer 105, which are sequentially formed on a substrate 101 of sapphire. The p-type GaN layer 105 is selectively provided between the barrier layer 104 and a gate electrode 108.

On regions of the barrier layer 104 located on both sides of the gate electrode 108, a source electrode 106 and a drain electrode 107 are formed to be spaced apart from the gate electrode 108. In this structure, the gate electrode 108 is made of, for example, palladium (Pd), and is in ohmic contact with the GaN layer 105. The source electrode 106 and the drain electrode 107 are each formed of a film made by stacking titanium (Ti) and aluminum (Al) from the substrate side.

FIG. 12 shows the relation between the drain current Id and the drain voltage Vds, which is obtained when pulse voltages having the same cycle are applied to the gate electrode 108 and the drain electrode 107 of the conventional JFET shown in FIG. 11, respectively. In this figure, the pulse width of the pulse voltage applied to the gate electrode 108 and the drain electrode 107 is set at 0.5 µs, and the pulse interval is set at 1 ms.

In FIG. 12, the plot A is obtained in the case where as a bias condition prior to application of a pulse voltage, both of the gate voltage and the drain voltage are 0 V, while the plot B is obtained in the case where as the bias condition, the gate voltage is 0 V and the drain voltage is 60 V. As shown in FIG. 12, for example, in the case of the plot B where the gate voltage Vgs is 5 V and the drain voltage Vds is 10 V, the drain current Id decreases by about 90 mA/mm as compared with the case of the plot A where the gate voltage Vgs is 5 V and the drain voltage Vds is 10 V. From this result, it is found that if a high drain voltage is applied to the drain electrode 107 prior to application of the bias voltage, the on-resistance increases. This phenomenon is the so-called current collapse. Since the occurrence of the current collapse significantly increases the on-resistance, this becomes an extremely serious problem for a power transistor to which a high drain voltage is applied.

SUMMARY OF THE INVENTION

In view of the conventional problem described above, an object of the present invention is to provide a solution capable of preventing current collapse caused in normally-off type nitride semiconductor devices applicable to power transistors.

To attain the above object, in the present invention, a nitride semiconductor device is designed so that not only a p-type nitride semiconductor layer is provided between a barrier layer and a gate electrode but also a p-type nitride semiconductor layer is also provided on regions of the barrier layer located between the gate electrode and a source electrode and between the gate electrode and a drain electrode.

To be more specific, a nitride semiconductor device according to the present invention is characterized in that the device includes: a substrate; a first nitride semiconductor layer formed over the substrate; a second nitride semiconductor layer formed on the first nitride semiconductor layer and having a larger band gap energy than the first nitride semiconductor layer; a third nitride semiconductor layer formed on the second nitride semiconductor layer and including a p-type nitride semiconductor with at least a single-layer structure; a gate electrode formed on the third nitride semiconductor layer; and a source electrode and a drain electrode formed in regions located on both sides of the gate electrode, respectively, and that the third nitride semiconductor layer has a thickness greater in a portion below the gate electrode than in a portion below the side of the gate electrode.

With the nitride semiconductor device according to the present invention, the p-type third nitride semiconductor layer formed on the second nitride semiconductor layer having a larger band gap energy than the first nitride semiconductor layer has a thickness greater in a portion below the gate electrode than in a portion below the side of the gate electrode. Thereby, the electron gas concentration in two-dimensional electron gas generated around the interface of the first nitride semiconductor layer with the second nitride semiconductor layer becomes lower in the region immediately below the gate electrode than in the region below the side of the gate electrode, so that the threshold voltage can be shifted to a positive direction. Moreover, in a portion of the first nitride semiconductor layer located below the side of the gate electrode, the two-dimensional electron gas concentration is higher than that in the case where the third nitride semiconductor layer is not provided. That is to say, if the third nitride semiconductor layer is not provided on the second nitride semiconductor layer, a surface state appears on the surface of the second nitride semiconductor layer, and electrons trapped by the appearing surface state has some influences such as a change of the two-dimensional electron gas to a depletion state. On the other hand, if the third nitride semiconductor layer is provided on the second nitride semiconductor layer like the present invention, the influences such as a change of the two-dimensional electron gas to a depletion state are decreased, so that the current collapse can be prevented.

In the nitride semiconductor device according to the present invention, the third nitride semiconductor layer may include a first p-type layer and a second p-type layer sequentially formed in this order from the substrate side, and the first p-type layer may have a thickness greater in the portion below the gate electrode than in portions located between the source electrode and the gate electrode and between the drain electrode and the gate electrode.

In the nitride semiconductor device according to the present invention, the third nitride semiconductor layer may include a first p-type layer and a second p-type layer sequentially formed in this order from the substrate side, and the second p-type layer may be in contact with the source electrode and the drain electrode.

Preferably, in the nitride semiconductor device according to the present invention, in the case where the third nitride semiconductor layer is made of the first p-type layer and the second p-type layer, the first nitride semiconductor layer is made of GaN, the second nitride semiconductor layer is made of $Al_xGa_{1-x}N$ $(0<x\leq1)$, the first p-type layer of the third nitride semiconductor layer is made of $Al_yGa_{1-y}N$ $(0\leq y\leq1)$, and the second p-type layer of the third nitride semiconductor layer is made of $Al_zGa_{1-z}N$ $(0\leq z\leq1$ and $y\neq z)$.

Preferably, in the nitride semiconductor device according to the present invention, in the case where the third nitride semiconductor layer is made of the first p-type layer and the second p-type layer, the first p-type layer of the third nitride semiconductor layer has a thickness of 15 nm or more.

Preferably, in the nitride semiconductor device according to the present invention, the third nitride semiconductor layer is made of a single-layer p-type semiconductor layer.

Preferably, in the nitride semiconductor device according to the present invention, in the case where the third nitride semiconductor layer is made of a single-layer p-type semiconductor layer, the first nitride semiconductor layer is made of GaN, the second nitride semiconductor layer is made of $Al_xGa_{1-x}N$ $(0<x\leq1)$, and the third nitride semiconductor layer is made of $Al_yGa_{1-y}N$ $(0<y\leq1)$.

Preferably, in the nitride semiconductor device according to the present invention, a transistor element formed of the gate electrode has a first threshold voltage higher than a second threshold voltage of a virtual transistor element formed as a virtual component and extending in a region below the side of the gate electrode through a surface depletion layer.

Preferably, in the nitride semiconductor device according to the present invention, the first threshold voltage is 2.5 V or more higher than the second threshold voltage.

Preferably, in the nitride semiconductor device according to the present invention, the source electrode and the drain electrode are formed to come into contact with the interface between the first nitride semiconductor layer and the second nitride semiconductor layer.

Preferably, in the nitride semiconductor device according to the present invention, the substrate exhibits conductivity.

Preferably, in the above case, the substrate is made of one of silicon and silicon carbide.

Preferably, in the above case, the source electrode is electrically connected to the substrate through a via hole penetrating the first nitride semiconductor layer, the second nitride semiconductor layer, and the third nitride semiconductor layer.

Preferably, the nitride semiconductor device according to the present invention further includes: an insulating film formed over the gate electrode and having a relative dielectric constant of 4 or lower; and an upper-side electrode provided on the insulating film and electrically connected to the drain electrode.

A first method for fabricating a nitride semiconductor device according to the present invention is characterized in that the method includes: the step (a) of sequentially forming, over a substrate, a first nitride semiconductor layer, a second nitride semiconductor layer having a larger band gap energy than the first nitride semiconductor layer, a p-type third nitride semiconductor layer, and a p-type fourth nitride semiconductor layer; the step (b) of selectively removing at least an upper part of a portion of the fourth nitride semiconductor layer located other than a gate electrode formation region, thereby forming the gate electrode formation region from the fourth nitride semiconductor layer; the step (c) of selectively removing at least portions of the third nitride semiconductor layer, the second nitride semiconductor layer, and an upper portion of the first nitride semiconductor which are located below both sides of the gate electrode formation region, thereby forming source and drain electrode formation regions having recess-shaped cross sections, respectively; the step (d) of forming a metal film in the source and drain electrode formation regions, thereby forming a source electrode and a drain electrode in contact with the interface between the second nitride semiconductor layer and the first nitride semiconductor layer, respectively; and the step (e) of forming a gate electrode on the gate electrode formation region.

With the first method for fabricating a nitride semiconductor device, the p-type third and fourth nitride semiconductor layers are formed on the second nitride semiconductor layer having a larger band gap energy than the first nitride semiconductor layer, and by the p-type third and fourth nitride semiconductor layers, the electron gas concentration in two-dimensional electron gas generated around the interface of the first nitride semiconductor layer with the second nitride semiconductor layer can be lower in a portion of the first nitride semiconductor layer located below the gate electrode than in the gate electrode region, so that the threshold voltage can be shifted to a positive direction. Moreover, in a portion of the first nitride semiconductor layer located below the side of the gate electrode, the two-dimensional electron gas concentration is higher than that in the case where the third nitride semiconductor layer is not provided, which increases the absolute value of the negative threshold voltage of a virtual transistor element provided as a virtual component and formed through a surface depletion layer. Thereby, the influence of the surface state on the two-dimensional electron gas generated in the area below the side of the gate electrode can be reduced, and thus the current collapse can be prevented.

In the first method for fabricating a nitride semiconductor device, in the step (b), upper parts of portions of the third nitride semiconductor layer located below the sides of the gate electrode formation region may also be removed selectively.

In the first method for fabricating a nitride semiconductor device, in the step (b), an upper part of the portion of the fourth nitride semiconductor layer other than the gate electrode formation region may be selectively removed, and in the step (c), parts of the remaining portion of the fourth nitride semiconductor layer located in the source and drain electrode formation regions may also be removed selectively.

A second method for fabricating a nitride semiconductor device according to the present invention is characterized in that the method includes: the step (a) of sequentially forming, over a substrate, a first nitride semiconductor layer, a second nitride semiconductor layer having a larger band gap energy than the first nitride semiconductor layer, and a p-type third nitride semiconductor layer; the step (b) of selectively removing an upper part of a portion of the third nitride semiconductor layer located other than a gate electrode formation region, thereby forming the gate electrode formation region from the third nitride semiconductor layer; the step (c) of selectively removing parts of the remaining portion of the third nitride semiconductor layer, the second nitride semiconductor layer, and an upper portion of the first nitride semiconductor layer which are located below both sides of the gate electrode formation region, thereby forming recess-shaped source and drain electrode formation regions, respectively; the step (d) of forming a metal film in the source and drain electrode formation regions, thereby forming a source electrode and a drain electrode in contact with the interface between the second nitride semiconductor layer and the first nitride semiconductor layer, respectively; and the step (e) of forming a gate electrode on the gate electrode formation region.

With the second method for fabricating a nitride semiconductor device according to the present invention, the p-type third nitride semiconductor layer is formed on the second nitride semiconductor layer having a larger band gap energy than the first nitride semiconductor layer, and by the p-type third nitride semiconductor layer, the electron gas concentration in two-dimensional electron gas generated around the interface of the first nitride semiconductor layer with the second nitride semiconductor layer can be lower in a portion of the first nitride semiconductor layer located below the gate electrode than in the portion thereof below the side of the gate electrode, so that the threshold voltage can be shifted to a positive direction. Moreover, in a portion of the first nitride semiconductor layer located below the side of the gate electrode, the two-dimensional electron gas concentration is higher than that in the case where the third nitride semiconductor layer is not provided, whereby the current collapse can be prevented.

As described above, with the nitride semiconductor device and its fabrication method according to the present invention, a normally-off type nitride semiconductor device having a small on-resistance and preventing the current collapse can be provided.

BEST MODE FOR CARRYING OUT THE INVENTION

First Embodiment

A first embodiment of the present invention will be described with reference to the accompanying drawings.

Figure 1A:
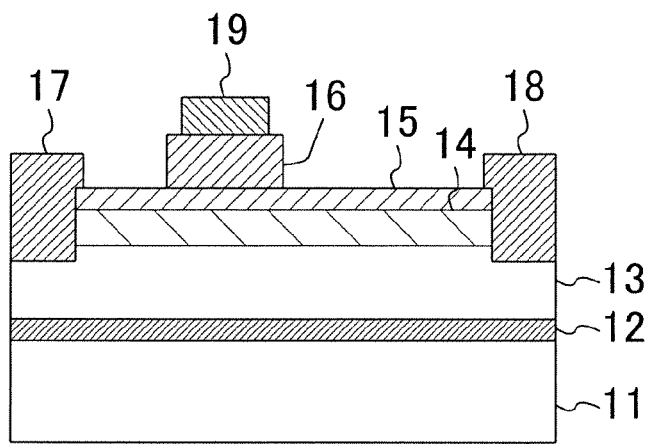
FIG. 1A is a sectional view showing a nitride semiconductor device according to a first embodiment of the present invention.

FIG. 1A shows a cross-sectional structure of a nitride semiconductor device (JFET) according to the first embodiment of the present invention. Referring to FIG. 1A, the nitride semiconductor device according to the first embodiment has a substrate 11, a buffer layer 12, a channel layer 13, a barrier layer 14, a p-type AlGaN layer 15, and a p-type GaN layer 16. The substrate 11 is made of sapphire and the orientation of the principal plane thereof is the (0001) plane. The buffer layer 12 of aluminum nitride (AlN) is formed on the principal plane of the substrate 11 and has a thickness of 100 nm. The channel layer 13 of undoped gallium nitride (GaN) is provided on the buffer layer 12 and has a thickness of The barrier layer 14 of undoped aluminum gallium nitride (AlGaN) is formed on the channel layer 13 and has a thickness of 25 nm. The p-type AlGaN layer 15 as a first p-type layer is formed on the barrier layer 14 and has a thickness of 15 nm. The p-type GaN layer 16 as a second p-type layer serves as a gate formation region on the p-type AlGaN layer 15 and has a thickness of 100 nm. In this specification, the word "undoped" indicates that no impurity for determining the conductivity type is introduced intentionally.

Into the p-type AlGaN layer 15, magnesium (Mg) with a concentration of about $1 \times 10^{19}$ cm$^{-3}$ is doped, and the p-type AlGaN layer 15 has a carrier concentration of about $1 \times 10^{18}$ cm$^{-3}$. The most part of the p-type GaN layer 16 has a carrier concentration nearly equal to that of the p-type AlGaN layer 15, and Mg with a concentration of about $1 \times 10^{20}$ cm$^{-3}$ is doped into a region thereof ranging from the top surface to a depth of about 10 nm.

The barrier layer 14 and the p-type AlGaN layer 15 are each made of, for example, $Al_{0.15}Ga_{0.85}N$.

In regions of the p-type AlGaN layer 15 and the barrier layer 14 located on both sides of the p-type GaN layer 16, openings are provided which are made by digging the upper portions of the channel layer 13, respectively. The openings are provided with a source electrode 17 and a drain electrode 18, respectively, and these electrodes are made of a Ti layer and an Al layer and formed to come into lateral contact with the heterointerface between the barrier layer 14 and the channel layer 13. As described above, the p-type AlGaN layer 15, the barrier layer 14, and the upper portion of the channel layer 13 are dug, and then the source electrode 17 and the drain electrode 18 are formed to come into direct contact with a two-dimensional electron gas (2DEG) layer which is formed around the heterointerface between the barrier layer 14 and the channel layer 13. Thereby, the contact resistance can be significantly reduced as compared with the case where the source electrode 17 and the drain electrode 18 are formed directly on the p-type AlGaN layer 15. In addition to this, an ohmic junction with a low contact resistance can be formed independently of the thicknesses of the p-type AlGaN layer 15 and the barrier layer 14.

On the p-type GaN layer 16 selectively formed on the p-type AlGaN layer 15, a gate electrode 19 of palladium (Pd) is provided which forms an ohmic junction with the p-type GaN layer 16. In this structure, the p-type GaN layer 16 and the gate electrode 19 are provided at a shifted location toward the source electrode 17 from the intermediate position between the source electrode 17 and the drain electrode 18. This is because the distance between the gate electrode 19 and the drain electrode 18 is made larger than the distance between the gate electrode 19 and the source electrode 17, whereby an electric field generated in applying a high drain voltage is relieved to improve the breakdown voltage of a transistor.

Figure 1B:
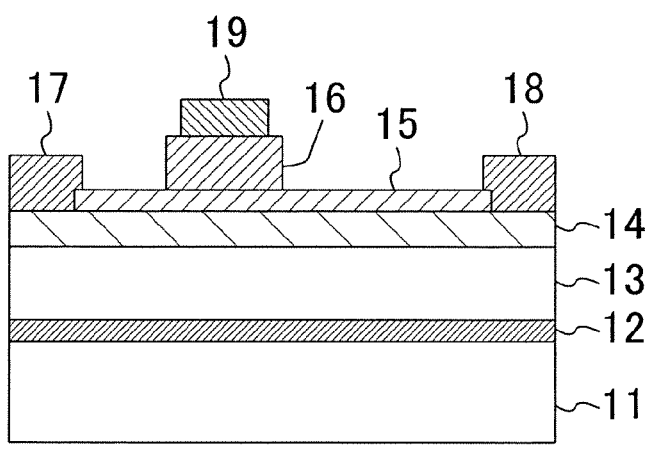
FIG. 1B is a sectional view showing a nitride semiconductor device according to a first modification of the first embodiment of the present invention.

The source electrode 17 and the drain electrode 18 do not have to be formed to dig the barrier layer 14 and the upper portion of the channel layer 13, and they may be formed directly on the p-type AlGaN layer 15. However, as shown in a first modification in FIG. 1B, from the viewpoint of the electronic properties of the both electrodes 17 and 18, it is preferable that at least the p-type AlGaN layer 15 is removed and the source electrode 17 and the drain electrode 18 are formed directly on the barrier layer 14. In this formation, it is acceptable that the barrier layer 14 is dug.

Figure 2:
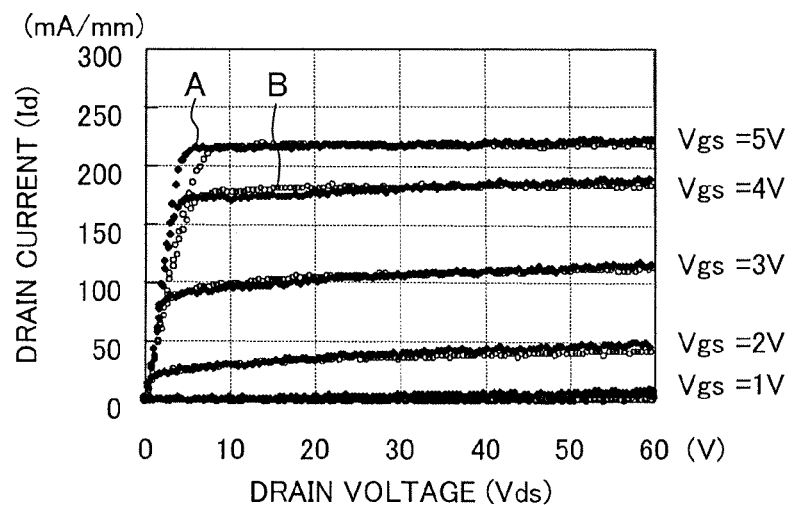
FIG. 2 is a graph showing the relation between the drain current and the drain voltage obtained when a pulse voltage is applied to the nitride semiconductor device according to the first embodiment of the present invention.

FIG. 2 shows the relation between the drain current Id and the drain voltage Vds, which is obtained when pulse voltages having the same cycle are applied to the gate electrode 19 and the drain electrode 18 of the nitride semiconductor device shown in FIG. 1A, respectively. In this figure, the pulse width of the pulse voltage applied to the gate electrode 19 and the drain electrode 18 is set at 0.5 µs, and the pulse interval thereof is set at 1 ms.

In FIG. 2, the plot A is obtained in the case where as a bias condition prior to application of a pulse voltage, both of the gate voltage and the drain voltage are 0 V, while the plot B is obtained in the case where as the bias condition, the gate voltage is 0 V and the drain voltage is 60 V. As shown by the plot B in FIG. 2, even though the gate voltage Vgs has any value of 1 to 5 V or the drain voltage Vds has any value of 10 to 60 V, the properties of the plot B are in close agreement with the properties of the plot A obtained in the case where a high drain voltage is not applied. From this, it is found that the on-resistance of the plot B does not differ from that of the plot A and thus the current collapse is prevented.

The following description will be made of the reason why the nitride semiconductor device according to the first embodiment can prevent the current collapse.

The conceivable reason is as follows. For the nitride semiconductor device according to the conventional example, a surface state appears in a portion of the barrier layer 104 located below the side of the gate electrode 108. Then, electrons trapped by the appearing surface state form a depletion layer, and the formed depletion layer has an influence on a channel (2DEG). On the other hand, for the nitride semiconductor device according to the first embodiment, a surface state appearing in a portion of the p-type AlGaN layer 15 located below the side of the gate electrode 19 has a small influence on a channel.

Figure 12:
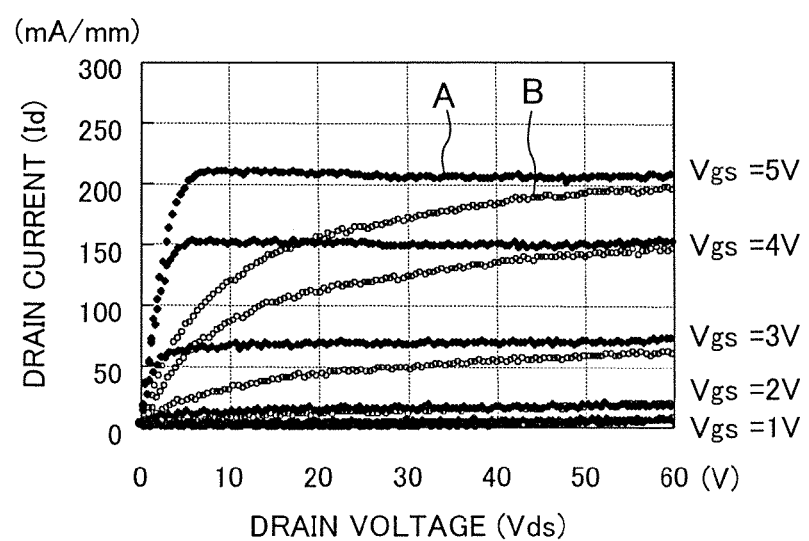
FIG. 12 is a graph showing the relation between the drain current and the drain voltage obtained when a pulse voltage is applied to the nitride semiconductor transistor according to the conventional example.

To be more specific, in the transistor according to the conventional example, when a high drain voltage immediately before pulse application is applied as shown by the plot B in FIG. 12, electrons trapped by the surface state appearing in the portion of the barrier layer 104 located below the side of the gate electrode 108 expand the depletion layer even to the channel. Thereby, even though the channel located below the gate electrode 108 turns into an on-state immediately after pulse application, the channel located between the gate and the drain does not turn into an on-state because release of electrons trapped in the surface state is slow. This results in provision of a reduced drain current as compared with the case of the plot A where a high drain voltage is not applied and thus the depletion layer produced by electron trapping is not expanded.

In contrast to this, in the nitride semiconductor device according to the first embodiment, the p-type AlGaN layer 15 is provided on the barrier layer 14. Thereby, when a high drain voltage immediately before pulse application is applied, the depletion layer produced by electrons trapped by the surface state in the p-type AlGaN layer 15 does not reach the channel. Therefore, the portion of the channel located below the side of the gate electrode 19 is always in the on-state. Then, when the channel located immediate below the gate electrode 19 turns on immediately after the pulse application, the channel located between the source and the drain turns into a fully open condition. This results in provision of a drain current equal to that obtained in the case where a high drain voltage is not applied, that is, the depletion layer produced by electron trapping is not expanded.

Figure 3:
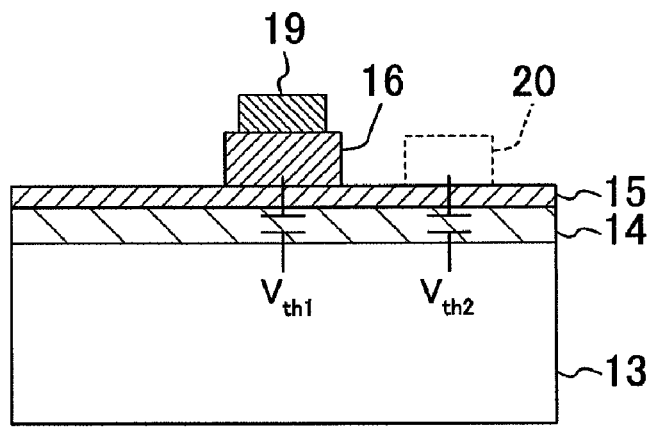
FIG. 3 is a schematic sectional view for explaining the threshold voltage of a virtual transistor which is formed of a virtual gate electrode located below the side of a gate electrode of the nitride semiconductor device according to the first embodiment of the present invention.

A mechanism to prevent the current collapse in the nitride semiconductor device according to the first embodiment will be described in details with reference to FIG. 3. FIG. 3 shows a schematic cross-sectional structure of main parts of the nitride semiconductor device in FIG. 1. In FIG. 3, schematic illustration is made of: a first threshold voltage $V_{th1}$ of the transistor formed of the gate electrode 19; and a second threshold voltage $V_{th2}$ of a virtual transistor formed of a virtual gate electrode 20 provided below the side of the gate electrode 19.

As described above, the JFET structure can be designed so that the two-dimensional electron gas concentration in the region of the channel located immediately below the gate electrode 19 is selectively made smaller than the two-dimensional electron gas concentration in the other regions. Thus, the first threshold voltage $V_{th1}$ at which the channel located immediately below the gate electrode 19 turns on is higher than the second threshold voltage $V_{th2}$ of the virtual transistor formed as a virtual component and extending in a region below the side of the gate electrode 19 through a surface depletion layer. In this condition, it is assumed that the virtual gate electrode 20 forms, with the p-type AlGaN layer 15, a Schottky junction with an energy barrier of about 0.7 to 0.9 eV. For this Schottky junction, use can be made of, for example, a Schottky electrode of nickel (Ni), palladium (Pd), or the like. The first threshold voltage $V_{th1}$ can be controllably changed from negative to positive by adjusting the thickness and the Al content of the barrier layer 14 made of undoped AlGaN.

When no voltage is applied to the gate electrode 19, two-dimensional electron gas is generated at the heterointerface between the barrier layer 14 located immediately below the virtual gate electrode 20 and the channel layer 13. Therefore, the second threshold voltage $V_{th2}$ has a negative value. As this second threshold voltage $V_{th2}$ is shifted to the negative direction, it becomes necessary to provide larger negative charges in the surface of the p-type AlGaN layer 15 in contact with the virtual gate electrode 20 in order to change the two-dimensional electron gas in the channel to a depletion state.

As is understood from the above, in an area between the gate and the drain of the nitride semiconductor device according to the first embodiment, the p-type AlGaN layer 15 is provided on the barrier layer 14, whereby electrons trapped by the surface state appearing in the p-type AlGaN layer 15 make it difficult to change the channel into an off-state.

Figure 4:
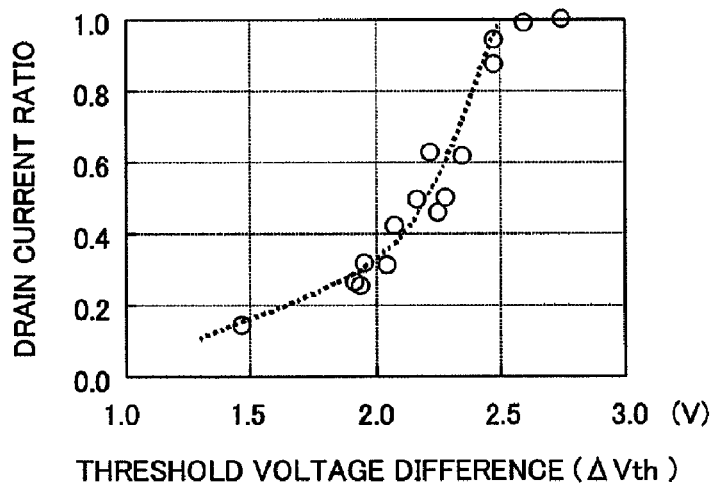
FIG. 4 is a graph showing the relation between the drain current ratio in applying a pulse voltage and the threshold voltage difference $\Delta V_{th}$ between the threshold voltage of the nitride semiconductor device according to the first embodiment of the present invention and the threshold voltage of the virtual transistor of the device.

FIG. 4 shows the relation between the difference $\Delta V_{th}$ between the first threshold voltage $V_{th1}$ and the second threshold voltage $V_{th2}$ ($=V_{th1}-V_{th2}$) and the drain current ratio in applying a pulse voltage, which is obtained by the nitride semiconductor device according to the first embodiment in the case where the thicknesses of the p-type AlGaN layer 15 and the barrier layer 14 are changed. In FIG. 4, the drain current used for the drain current ratio is obtained in the case of a drain voltage of 10 V and a gate voltage of 5 V in applying a pulse voltage, and the drain current ratio represents the ratio of the drain current in the case of a drain voltage of 60 V to the drain current in the case of a drain voltage of 0 V that is obtained immediately before pulse voltage application. Therefore, this ratio indicates the fact that as the drain current ratio approaches one, the current collapse is prevented more reliably.

As shown in FIG. 4, there is a definite correlation between the threshold voltage difference $\Delta V_{th}$ and the drain current ratio, and the wider the threshold voltage difference $\Delta V_{th}$ is, the more reliably the current collapse is prevented. In particular, if the threshold voltage difference $\Delta V_{th}$ is 2.5 V or more, the drain current ratio becomes nearly one. From this, it is found that such condition can completely prevent the current collapse.

In order to widen the threshold voltage difference $\Delta V_{th}$, thickening of the p-type AlGaN layer 15 is effective.

Figure 5:
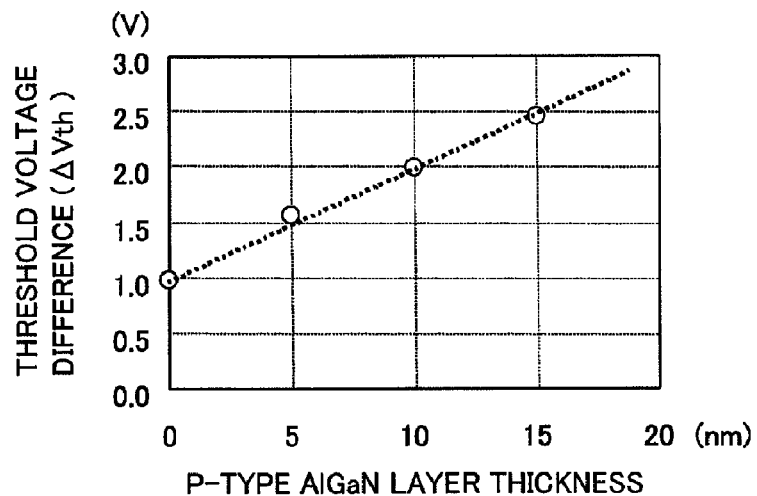
FIG. 5 is a graph showing the relation between the thickness of a p-type AlGaN layer and the threshold voltage difference $\Delta V_{th}$ in the nitride semiconductor device according to the first embodiment of the present invention.

FIG. 5 shows the relation between the thickness of the p-type AlGaN layer 15 and the threshold voltage difference $\Delta V_{th}$, obtained by the nitride semiconductor device according to the first embodiment. As the thickness of the p-type AlGaN layer 15 is made greater, the second threshold voltage $V_{th2}$ can be shifted to the negative direction with the first threshold voltage $V_{th1}$ hardly changed. This makes it possible to widen the threshold voltage difference $\Delta V_{th}$, so that an increase in on-resistance can be avoided, that is, the current collapse can be prevented.

If the barrier layer 14 made of undoped AlGaN is thickened or the Al content thereof is raised, the second threshold voltage $V_{th2}$ can be shifted to the negative direction. However, simultaneously with this, the first threshold voltage $V_{th1}$ is also shifted to the negative direction. Therefore, it is impossible to widen the threshold voltage difference $\Delta V_{th}$, and furthermore it becomes difficult even to maintain the normally-off state.

To avoid such a problem, in the first embodiment, the p-type AlGaN layer 15 is provided on the barrier layer 14, to be more specific, on regions of the barrier layer 14 located below both sides of the gate electrode 19, whereby not only the normally-off state can be maintained but also the threshold voltage difference $\Delta V_{th}$ can be widened. Therefore, the current collapse can be prevented. In particular, from FIGS. 4 and 5, it is found that in order to set the threshold voltage difference $\Delta V_{th}$ at 2.5 V or more and completely prevent the current collapse, thickening of the p-type AlGaN layer 15 to 15 nm or more is effective. However, if the p-type AlGaN layer 15 is thickened too much, a leakage current will flow through the p-type AlGaN layer 15 between the gate and the drain or between the gate and the source. Therefore, the thickness of the p-type AlGaN layer 15 is desirably about 30 nm or smaller.

Hereinafter, a fabrication method of the nitride semiconductor device thus constructed will be described with reference to the accompanying drawings.

FIGS. 6A to 6E show cross-sectional structures of successive process steps of the method for fabricating a nitride semiconductor device according to the first embodiment.

Figure 6A:
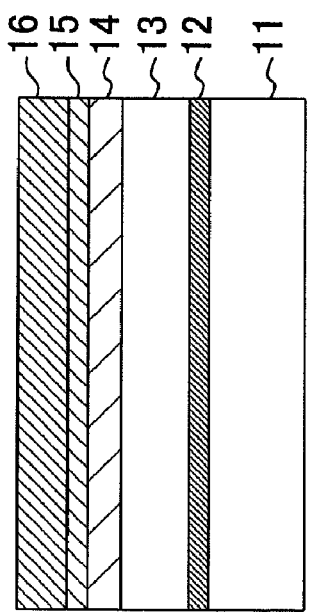
FIGS. 6A to 6E are sectional views showing successive process steps of a method for fabricating a nitride semiconductor device according to the first embodiment of the present invention.

Referring to FIG. 6A, first, by a metal organic chemical vapor deposition (MOCVD) method or the like, the 100 nm-thick buffer layer 12 of AlN, the 2 μm-thick channel layer 13 of undoped GaN, the 25 nm-thick barrier layer 14 of undoped AlGaN, the 15 nm-thick p-type AlGaN layer 15, and the 100 nm-thick p-type GaN layer 16 are sequentially grown by epitaxial growth on the principal plane of the substrate 11 of sapphire which has an orientation of (0001) plane. Thereby, an epitaxial growth layer is formed.

Figure 6B:
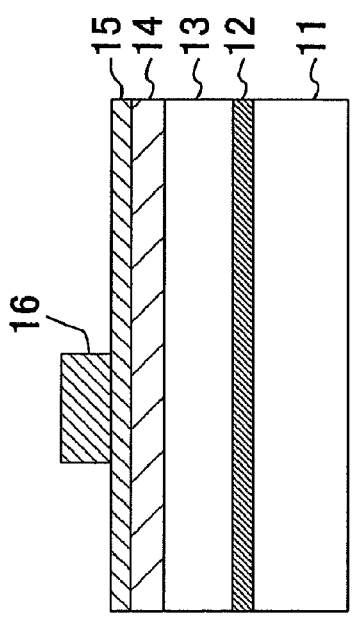

Next, as shown in FIG. 6B, for example, by a lithography method and a dry etching method by an inductively coupled plasma (ICP) or the like using chlorine ($Cl_2$) gas and sulfur hexafluoride ($SF_6$) gas as an etching gas, selective etching is performed on a portion of the p-type GaN layer 16 of the epitaxial growth layer other than a gate formation region. In this etching, it is also possible to expose the p-type AlGaN layer 15 by constant etching in which the GaN layer and the AlGaN layer are etched at almost the same etching rate. However, in order to enhance the process repeatability, selective etching in which the etching rate of the GaN layer is higher than that of the AlGaN layer is effective.

Figure 6C:
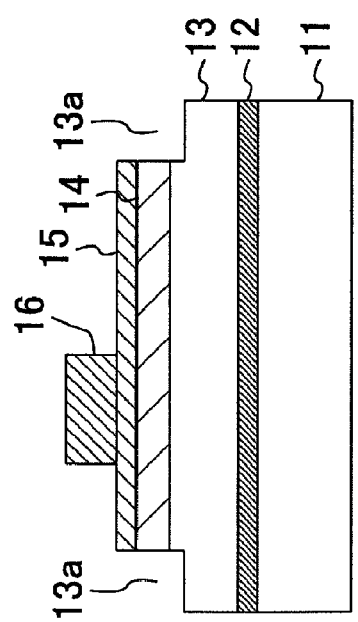

Subsequently, as shown in FIG. 6C, for example, by a lithography method and a dry etching method such as ICP etching with chlorine gas, the p-type AlGaN layer 15, the barrier layer 14, and the upper portion of the channel layer 13 are selectively removed to form recesses 13a serving as source and drain electrode formation regions in the epitaxial layer, respectively.

Figure 6D:
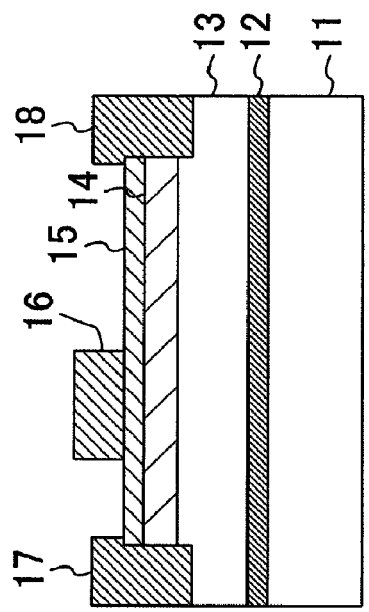

As shown in FIG. 6D, for example, by a liftoff method, the formed recesses 13a are formed with the source electrode 17 and the drain electrode 18 having a structure made by staking a Ti layer and an Al layer, respectively. Thereafter, a thermal treatment (annealing) is performed in a nitrogen ($N_2$) atmosphere at 650° C.

Figure 6E:
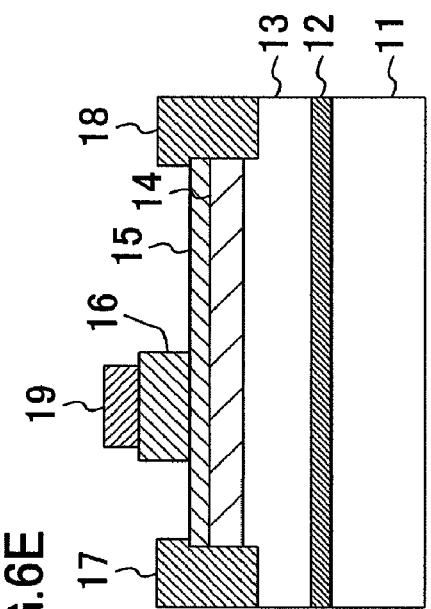

Next, as shown in FIG. 6E, for example, by a liftoff method, the gate electrode 19 made of Pd is selectively formed on the p-type GaN layer 16. In the manner described above, the nitride semiconductor device according to the first embodiment can be provided.

Second Modification of First Embodiment

In the first embodiment, as shown in FIG. 1, in the p-type AlGaN layer 15 provided on the barrier layer 14, the thickness below the gate electrode 19 and the thickness below the side of the gate electrode 19 are substantially identical.

Figure 7:
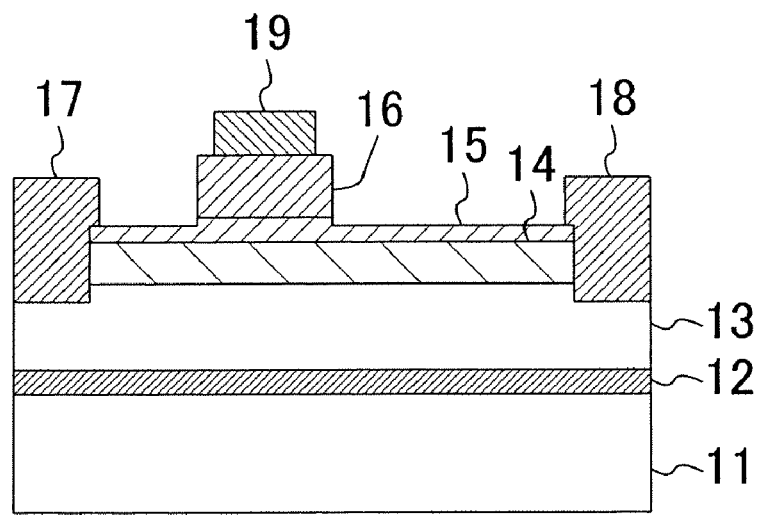
FIG. 7 is a sectional view showing a nitride semiconductor device according to a second modification of the first embodiment of the present invention.

However, as in the case of a second modification shown in FIG. 7, in the p-type AlGaN layer 15, the thickness below the side of the gate electrode 19 may be made smaller than the thickness below the gate electrode 19 so that the thickness below the gate electrode 19 is set at about 20 nm and the thickness below the side of the gate electrode 19 is set at about 15 nm.

With this structure, the nitride semiconductor device according to the second modification can prevent the current collapse like the first embodiment. In addition to this, a corner provided at the side of the gate electrode 19 and having a maximum electric field intensity in applying a high drain voltage is formed only of the p-type AlGaN layer 15 with a large band gap energy, so that the breakdown voltage of the transistor can be improved.

Third Modification of First Embodiment

Figure 8:
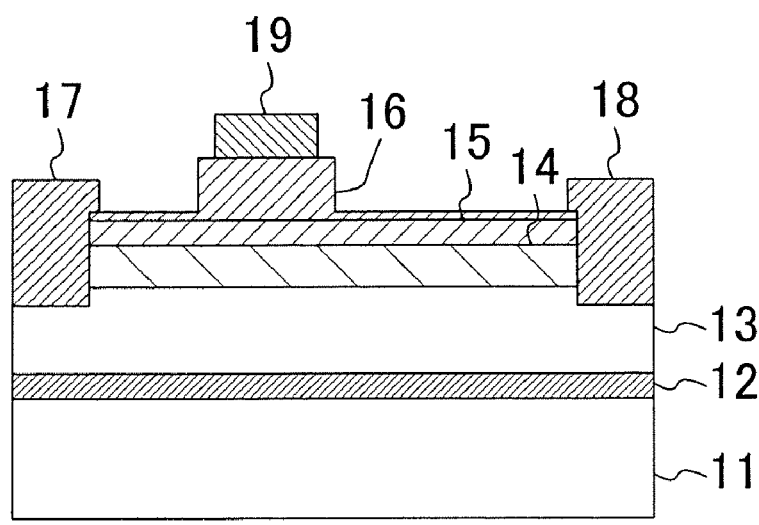
FIG. 8 is a sectional view showing a nitride semiconductor device according to a third modification of the first embodiment of the present invention.

Not only the nitride semiconductor device has the structure in which the p-type GaN layer 16 is formed only below the gate electrode 19, but also it may have a structure in which, like a nitride semiconductor device according to the third modification shown in FIG. 8, part of the p-type GaN layer 16 is also formed below the side of the gate electrode 19. In this structure, if an exposed portion of the p-type GaN layer 16 formed below the side of the gate electrode 19 is thick, it will cause an increase in a leakage current flowing between the gate and the drain or between the gate and the source. Thus, the exposed portion desirably has a thickness of about 20 nm or less. This makes it possible to widen the above-described threshold voltage difference $\Delta V_{th}$, whereby the current collapse can be prevented.

Second Embodiment

A second embodiment of the present invention will be described below with reference to the accompanying drawings.

Figure 9:
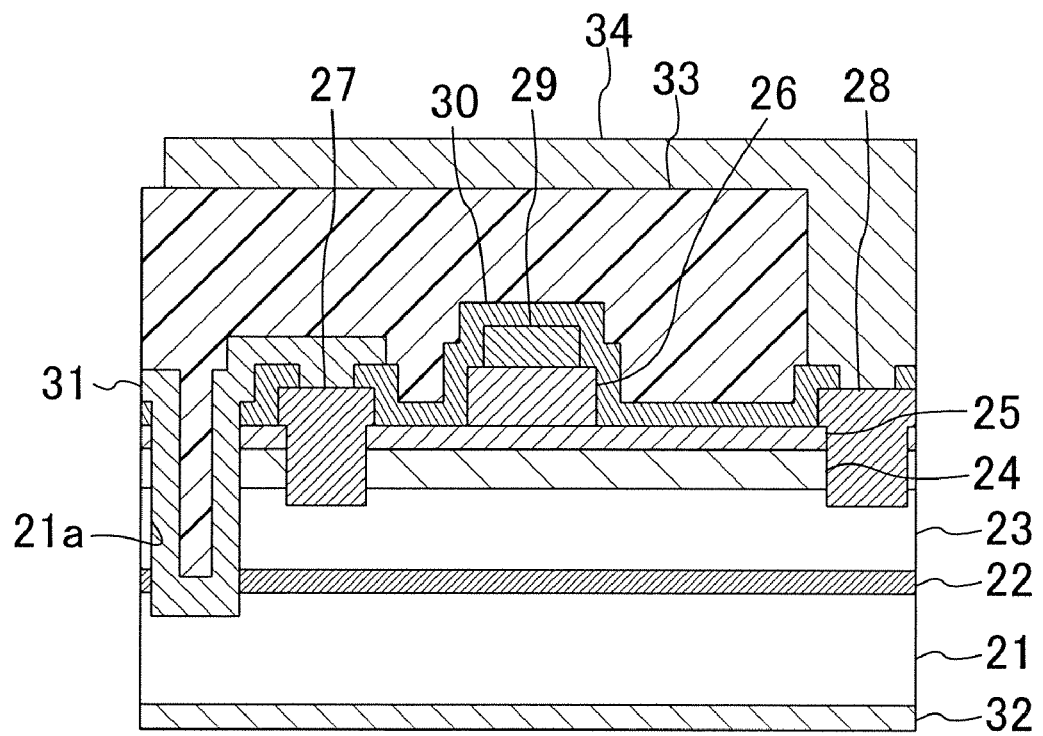
FIG. 9 is a sectional view showing a nitride semiconductor device according to a second embodiment of the present invention.

FIG. 9 shows a cross-sectional structure of a nitride semiconductor device according to a second embodiment of the present invention. Referring to FIG. 9, as an exemplary substrate with conductivity, use is made of a substrate 21 of n-type silicon (Si) whose principal plane has an orientation of (111) plane. On the principal plane of the substrate 21, an epitaxial layer identical to that of the first embodiment is framed. To be more specific, on the substrate 21, a buffer layer 22 of AlN, a channel layer 23 of GaN, a barrier layer 24 of undoped AlGaN, a p-type AlGaN layer 25, and a p-type GaN layer 26 are sequentially formed by a MOCVD method or the like.

The p-type GaN layer 26 is selectively formed only in an area substantially below a gate electrode 29 of Pd.

A source electrode 27 and a drain electrode 28 each made of Ti and Al are formed in recesses reaching the upper portion of the channel layer 23, respectively.

On the p-type AlGaN layer 25, a passivation film 30 made of silicon nitride (SiN) is formed over the entire surface to cover the gate electrode 29 and the p-type GaN layer 26.

The second embodiment is characterized in that in a region (outside region) of the side of the source electrode 27 away from the gate electrode 29, a via hole 21a is formed to penetrate the passivation film 30, the p-type AlGaN layer 25, the barrier layer 24, the channel layer 23, and the buffer layer 22. The source electrode 27 is electrically connected to the substrate 21 by a metal interconnect 31 of aluminum (Al) formed to extend across the source electrode 27 and the via hole 21a.

A backside electrode 32 of an AuGeSb alloy is formed on the surface (back surface) of the substrate 21 opposite to the buffer layer 22.

Over the entire surface of the passivation film 30 including the metal interconnect 31, an interlayer film 33 of polyimide resin is formed which has a thickness of about 5 µm and a relative dielectric constant of about 3.

The interlayer film 33 is formed with a contact hole exposing the drain electrode 28, and the formed contact hole is filled to form an upper-side drain electrode 34 of Al. In the upper-side drain electrode 34, one end is in contact with the drain electrode 28, and the other end extends over the interlayer film 33 to above the source electrode 27.

With such a structure, a source voltage can be applied through the backside electrode 32 formed on the back surface of the substrate 21, while a drain voltage can be applied through the upper-side drain electrode 34 formed above the gate electrode 29. This eliminates the necessity to form an electrode pad outside an active region of a transistor element. Therefore, the chip size can be reduced.

Furthermore, the source electrode 27 is connected to the backside electrode 32 and the drain electrode 28 is connected to the upper-side drain electrode 34. This eliminates the necessity to provide additional interconnects for the source and drain electrodes. As a result, the interconnect resistance caused by the electrode interconnect can be reduced to decrease the on-resistance of the transistor obtained after mounting.

Moreover, since the interlayer film 33 is made of polyimide resin with a low relative dielectric constant, the parasitic capacitance caused by the upper-side drain electrode 34 can be reduced to also enhance the switching speed of the transistor. The material for the interlayer film 33 is not limited to polyimide resin, and as shown in Table 1 that follows below, a material with a relative dielectric constant of 4 or lower is effective at reducing the parasitic capacitance.

TABLE 1

| Material for Interlayer Film | Relative Dielectric Constant |
|---|---|
| Silicon Oxide | 4 |
| Polyimide | 3 |
| Benzocyclobutene | 2.6 |

The material for the substrate 21 with conductivity is not limited to silicon (Si), and alternatively silicon carbide (SiC) can be used there as.

Third Embodiment

A third embodiment of the present invention will be described below with reference to the accompanying drawings.

Figure 10:
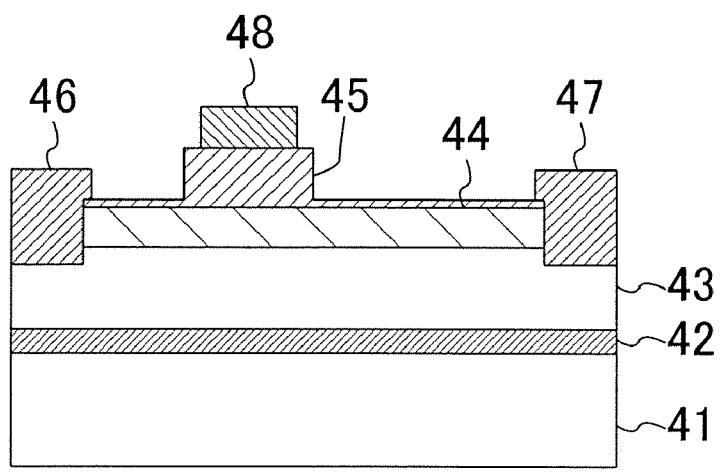
FIG. 10 is a sectional view showing a nitride semiconductor device according to a third embodiment of the present invention.
Figure 11:
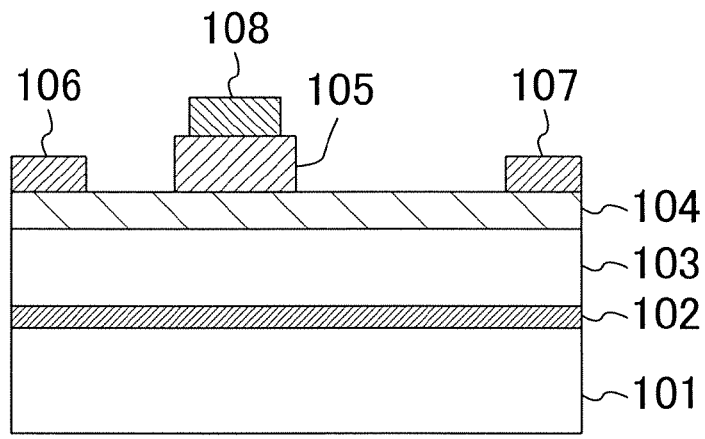
FIG. 11 is a sectional view showing a nitride semiconductor transistor according to a conventional example.

FIG. 10 shows a cross-sectional structure of a nitride semiconductor device according to a third embodiment of the present invention. Referring to FIG. 10, the nitride semiconductor device according to the third embodiment includes a substrate 41, a buffer layer 42, a channel layer 43, a barrier layer 44, and a p-type GaN layer 45. The substrate 41 is made of sapphire and has a principal plane whose orientation is the (0001) plane. The buffer layer 42 of AlN is formed on the principal plane of the substrate 41 and has a thickness of 100 nm. The channel layer 43 of undoped GaN is provided on the buffer layer 42 and has a thickness of 2 μm. The barrier layer 44 of undoped AlGaN is formed on the channel layer 43 and has a thickness of 25 nm. The p-type GaN layer 45 is formed on the barrier layer 44, and a portion thereof located below a gate electrode 48 of Pd has a thickness of 100 nm and a portion thereof located below the side of the gate electrode 48 has a thickness of about 15 nm.

The p-type GaN layer 45 has Mg doped at a concentration of about $1 \times 10^{19}$ cm$^{-3}$, and has a carrier concentration of about $1 \times 10^{18}$ cm$^{-3}$. Into the region thereof located below the gate electrode 48 and extending from the top surface to a thickness of about 10 nm, Mg is doped at a concentration of about $1 \times 10^{20}$ cm$^{-3}$.

The barrier layer 44 is made of, for example, $Al_{0.15}Ga_{0.85}N$.

In regions of the p-type GaN layer 45 and the barrier layer 44 located on both sides of the gate electrode 48, openings are provided which are made by digging the upper portions of the channel layer 43, respectively. The openings are provided with a source electrode 46 and a drain electrode 47, respectively, and these electrodes are made of a Ti layer and an Al layer and formed to come into lateral contact with the heterointerface between the barrier layer 44 and the channel layer 43.

The gate electrode 48 is provided at a shifted location toward the source electrode 46.

Thus, in the nitride semiconductor device according to the third embodiment, on the barrier layer 44 of undoped AlGaN, the p-type GaN layer 45 is provided which has a thickness of 100 nm in the portion below the gate electrode 48 and a thickness of about 15 nm in the portion below the side of the gate electrode 48.

As described above, the p-type GaN layer 45 of the device according to the third embodiment is formed as a single piece although the portion thereof below the gate electrode 48 and the portion thereof below the side of the gate electrode 48 have different thicknesses. Even with this structure, the above-described threshold voltage difference $\Delta V_{th}$ between the transistor element and the virtual transistor element can be widened, so that the current collapse can be prevented.

The AlGaN layer and the GaN layer differ in lattice constant. Thus, as the thickness of the AlGaN layer is greater, it becomes difficult to grow the crystal. However, in the nitride semiconductor device according to the third embodiment, unlike the first and second embodiments, the p-type AlGaN layer is not provided between the barrier layer of undoped AlGaN and the p-type GaN layer. This facilitates crystal growth.

If the portion of the p-type GaN layer 45 located below the side of the gate electrode 48 is thicker, it will cause an increase in a leakage current flowing between the gate and the drain or between the gate and the source. Thus, the thickness of the portion of the p-type GaN layer 45 located below the side of the gate electrode 48 is desirably about 20 nm or smaller.

In the method for fabricating a semiconductor device according to the third embodiment, it is sufficient that by a MOCVD method or the like, the above-shown layers from the barrier layer 42 to the p-type GaN layer 45 are sequentially formed by epitaxial growth on the substrate 41 and then selective dry etching is performed only on the portion of the p-type GaN layer located below the side of the gate electrode formation region.

As described above, with the nitride semiconductor device and its fabrication method according to the present invention, a normally-off type nitride semiconductor device having a small on-resistance and preventing the current collapse can be provided, and thus they are useful for a power transistor for use in power supply circuits and the like.

What is claimed is:

1. A nitride semiconductor device comprising:
   a substrate;
   a first nitride semiconductor layer formed over the substrate;
   a second nitride semiconductor layer formed on the first nitride semiconductor layer and having a larger band gap energy than the first nitride semiconductor layer;
   a third nitride semiconductor layer formed on the second nitride semiconductor layer and including a p-type nitride semiconductor with at least a single-layer structure;
   a gate electrode formed on the third nitride semiconductor layer; and
   a source electrode and a drain electrode formed in regions located on both sides of the gate electrode, respectively,
   wherein the third nitride semiconductor layer has a thickness greater in a portion below the gate electrode than in a portion below the side of the gate electrode,
   wherein the third nitride semiconductor layer includes a first p-type layer and a second p-type layer sequentially formed in this order from the substrate side, and
   the first p-type layer has a thickness greater in the portion below the gate electrode than in portions located between the source electrode and the gate electrode and between the drain electrode and the gate electrode.

2. The device of claim 1,
   wherein the first nitride semiconductor layer is made of GaN,
   the second nitride semiconductor layer is made of $Al_xGa_{1-x}N$ ($0<x \leq 1$),
   the first p-type layer of the third nitride semiconductor layer is made of $Al_yGa_{1-y}N$ ($0 \leq y \leq 1$), and
   the second p-type layer of the third nitride semiconductor layer is made of $Al_zGa_{1-z}N$ ($0 \leq z \leq 1$ and $y \neq z$).

3. The device of claim 1, wherein the first p-type layer of the third nitride semiconductor layer has a thickness of 15 nm or more.

4. A nitride semiconductor device comprising:
a substrate;
a first nitride semiconductor layer formed over the substrate;
a second nitride semiconductor layer formed on the first nitride semiconductor layer and having a larger band gap energy than the first nitride semiconductor layer;
a third nitride semiconductor layer formed on the second nitride semiconductor layer and including a p-type nitride semiconductor with at least a single-layer structure;
a gate electrode formed on the third nitride semiconductor layer; and
a source electrode and a drain electrode formed in regions located on both sides of the gate electrode, respectively,
wherein the third nitride semiconductor layer has a thickness greater in a portion below the gate electrode than in a portion below the side of the gate electrode,
wherein the third nitride semiconductor layer is made of a single-layer p-type semiconductor layer.

5. The device of claim 4,
wherein the first nitride semiconductor layer is made of GaN,
the second nitride semiconductor layer is made of $Al_xGa_{1-x}N$ ($0<x\leq1$), and
the third nitride semiconductor layer is made of $Al_yGa_{1-y}N$ ($0\leq y\leq1$).

* * * * *